(12) United States Patent
Shimura et al.

(10) Patent No.: US 9,182,665 B2
(45) Date of Patent: Nov. 10, 2015

(54) WHITE CURABLE COMPOSITION FOR PRINTED CIRCUIT BOARD, CURED COATING FILM USING THE SAME, AND PRINTED CIRCUIT BOARD

(71) Applicant: TAIYO INK MFG. CO., LTD., Hiki-gun (JP)

(72) Inventors: Masayuki Shimura, Namegawa-machi (JP); Yoshiyuki Furuta, Ranzan-machi (JP); Masao Yumoto, Yorii-machi (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 14/501,962

(22) Filed: Sep. 30, 2014

(65) Prior Publication Data

US 2015/0093690 A1 Apr. 2, 2015

(30) Foreign Application Priority Data

Sep. 30, 2013 (JP) ................................ 2013-205345

(51) Int. Cl.
*C11D 11/00* (2006.01)
*G03F 7/004* (2006.01)
*G03F 7/028* (2006.01)
*G03F 7/027* (2006.01)
*G03F 7/105* (2006.01)

(52) U.S. Cl.
CPC .............. *G03F 7/0048* (2013.01); *G03F 7/027* (2013.01); *G03F 7/028* (2013.01); *G03F 7/105* (2013.01)

(58) Field of Classification Search
CPC ....... G03F 7/028; G03F 7/0043; G03F 7/038; H05K 3/287; H05K 3/3452
USPC .............. 430/18, 270.1, 280.1, 281.1, 288.1; 427/511, 466; 522/81
See application file for complete search history.

(56) References Cited

U.S. PATENT DOCUMENTS

| | | | |
|---|---|---|---|
| 2004/0024091 A1* | 2/2004 | Yamada et al. | 523/160 |
| 2012/0189822 A1* | 7/2012 | Ito et al. | 428/195.1 |
| 2014/0290990 A1 | 10/2014 | Shimura et al. | |

FOREIGN PATENT DOCUMENTS

| | | | |
|---|---|---|---|
| JP | 2007-322166 A | * | 12/2007 |
| JP | 2007-322546 | | 12/2007 |
| JP | 2009-102623 A | | 5/2009 |
| JP | 2010-117703 | | 5/2010 |
| JP | 2010-229220 A | | 10/2010 |
| JP | 2010-266819 A | | 11/2010 |
| JP | 2011-138037 A | | 7/2011 |
| JP | 2011-232402 A | | 11/2011 |

OTHER PUBLICATIONS

Computer-generated translation of JP 2007-322166 (Dec. 2007).*
Derwent English-language abstract of WO 2006/035679 (Apr. 2006).*
U.S. Appl. No. 14/227,249, filed Mar. 27, 2014, Shimura, et al.
U.S. Appl. No. 14/501,630, filed Sep. 30, 2014, Shimura, et al.
Office Action issued Aug. 5, 2014 in Japanese Patent Application No. 2013-205345 (with partial English language translation).

* cited by examiner

*Primary Examiner* — John A McPherson
(74) *Attorney, Agent, or Firm* — Oblon, McClelland, Maier & Neustadt, L.L.P.

(57) ABSTRACT

An object of the present invention is to obtain a white curable composition that can yield a highly reflective cured coating film without requiring a complicated step and show good dispersion even without being subjected to an extended dispersion treatment. Provided is a white curable composition for a printed circuit board comprising: (A) a white pigment; (B) a (meth)acrylate compound having a hydroxyl group; (C) a photopolymerization initiator; and (D) a wetting dispersant. The above-described (A) white pigment is preferably titanium oxide. Further, it is also preferred that the above-described titanium oxide be a rutile-type titanium oxide and have a maximum particle size of 1 μm or smaller.

20 Claims, No Drawings

WHITE CURABLE COMPOSITION FOR PRINTED CIRCUIT BOARD, CURED COATING FILM USING THE SAME, AND PRINTED CIRCUIT BOARD

TECHNICAL FIELD

The present invention relates to a white curable composition for a printed circuit board. More particularly, the present invention relates to a UV-curable white composition to be used in an ink-jet method; a cured coating film for a printed circuit board using the same, which is used in at least one of resist formation, marking and etching; and a printed circuit board having a pattern obtained using the same.

BACKGROUND ART

When forming an etching resist, a solder resist, a symbol marking or the like on a printed circuit board, a technique in which a high-viscosity composition is coated on a substrate by a printing method such as screen printing and an ink is then cured by irradiation with an active energy ray has been generally employed.

In addition, in order to obtain a highly reflective cured coating film such as an LED substrate, a white pigment or coloring agent is incorporated into a curable composition for a printed circuit board.

RELATED ART DOCUMENTS

Patent Documents

Patent Document 1: Japanese Unexamined Patent Application Publication No. 2007-322546

Patent Document 2: Japanese Unexamined Patent Application Publication No. 2010-117703

SUMMARY OF THE INVENTION

Problems to be Solved by the Invention

However, conventional white compositions for printed circuit boards are required to contain a large amount of a white pigment; therefore, an extended dispersion treatment is necessary in order to achieve good dispersion. Furthermore, since conventional high-viscosity compositions are generally coated in layers of coating films so as to realize high reflectance, it is required to perform the post-printing step of pre-curing the coating films by drying, UV irradiation or the like; therefore, it is difficult to repeatedly coating such composition on the same spot.

In view of the above, an object of the present invention is to obtain a white curable composition which can show good dispersion even without being subjected to an extended dispersion treatment and yield a highly reflective cured coating film without requiring a complicated step.

Means for Solving the Problems

The present inventors intensively studied to solve the above-described problems and consequently discovered that, by using a composition which comprises a specific (meth)acrylate compound, a photopolymerization initiator and a wetting dispersant in addition to a white pigment, good dispersion and excellent filtration efficiency can be attained even with a short dispersion treatment and a cured coating film that is excellent in properties such as adhesiveness and heat resistance can be obtained. Further, the present inventors also discovered that, since the number of required steps can be reduced by allowing the composition to have a low viscosity conforming to an ink-jet method or the like and performing the printing and pre-curing thereof simultaneously, it becomes easy to coat the composition in layers on the same spot and to cope with an increase in the reflectance caused by thick coating, thereby completing the present invention.

That is, the white curable composition for a printed circuit board according to the present invention comprises: (A) a white pigment; (B) a (meth)acrylate compound having a hydroxyl group; (C) a photopolymerization initiator; and (D) a wetting dispersant.

In the white curable composition for a printed circuit board according to the present invention, it is preferred that the above-described (A) white pigment be titanium oxide.

Further, in the white curable composition for a printed circuit board according to the present invention, it is preferred that the above-described titanium oxide be a rutile-type titanium oxide.

Still further, in the white curable composition for a printed circuit board according to the present invention, it is preferred that the above-described titanium oxide has a maximum particle size of 1 µm or smaller.

Yet still further, in the white curable composition for a printed circuit board according to the present invention, it is preferred that the above-described (D) wetting dispersant has an acid value.

It is also preferred that the white curable composition for a printed circuit board according to the present invention further comprise a bifunctional (meth)acrylate compound.

Further, in the white curable composition for a printed circuit board according to the present invention, it is preferred that the above-described bifunctional (meth)acrylate compound has a viscosity of 5 to 50 mPa·s at 25° C.

Moreover, it is preferred that the white curable composition for a printed circuit board according to the present invention further comprise a thermosetting component.

Further, it is preferred that the white curable composition for a printed circuit board according to the present invention has a viscosity of 5 to 50 mPa·s at 50° C.

Still further, it is preferred that the white curable composition for a printed circuit board according to the present invention has a Y value of 70 or greater at a film thickness of 30 µm.

The cured coating film according to the present invention is obtained by irradiating any one of the above-described white curable compositions for a printed circuit board with light.

The printed circuit board according to the present invention comprises a pattern-cured coating film obtained by printing any one of the above-described white curable compositions for a printed circuit board on a substrate and then irradiating the thus printed white curable composition with light.

The printed circuit board according to the present invention comprises a pattern-cured coating film obtained by printing any one of the above-described white curable compositions for a printed circuit board on a substrate by an ink-jet printing method and then irradiating the thus printed white curable composition with light.

Effects of the Invention

By the present invention, a white curable composition which can yield a highly reflective cured coating film without requiring a complicated step and show good dispersion even without being subjected to an extended dispersion treatment can be obtained. In addition, the white curable composition according to the present invention can yield a cured coating film that is excellent in various properties such as adhesion with copper and substrates, hardness, solvent resistance and heat resistance. Moreover, the white curable composition for a printed circuit board according to the present invention can be suitably used as an ink-jet composition.

MODE FOR CARRYING OUT THE INVENTION

The white curable composition for a printed circuit board according to the present invention (hereinafter, also referred to as "curable composition") is characterized by comprising: (A) a white pigment (component (A)); (B) a (meth)acrylate compound having a hydroxyl group (component (B)); (C) a photopolymerization initiator (component (C)); and (D) a wetting dispersant (component (D)).

In the curable composition of the present invention, the particles contained therein have a maximum size of preferably 0.1 to 5 μm, more preferably 0.1 to 1 μm. The reason for this is that, when the maximum particle size is 0.1 μm or larger, the cohesive force of the particles is not overly strong, while when the maximum particle size is 5 μm or smaller, problems such as nozzle clogging during ink-jet printing is not likely to occur.

The maximum size of the particles contained in the composition can be measured using a particle size distribution analyzer and the D100 value is defined as the maximum particle size.

It is noted here that the term "(meth)acrylate" used herein is a general term for acrylates, methacrylates and mixtures thereof, and this is hereinafter applicable to all similar expressions.

[(A) White Pigment]

In the present invention, as the (A) white pigment, a known white pigment such as titanium oxide, zinc oxide, magnesium oxide, zirconium oxide, aluminum oxide, barium sulfate, silica, talc, mica, aluminum hydroxide, calcium silicate, aluminum silicate, hollow resin particle or zinc sulfide can be used. Thereamong, titanium oxide is preferred because of its high coloring property and reflectance. These white pigments may be used individually, or two or more thereof may be used in combination. The titanium oxide may be of a rutile type or an anatase type; however, a rutile-type titanium is preferably used because of its coloring property, concealability and stability. An anatase-type titanium oxide, which is also titanium oxide, has a higher whiteness than a rutile-type titanium oxide and is thus often used as a white pigment; however, since an anatase-type titanium oxide has photocatalytic activity, it may cause discoloration of a resin contained in an insulating resin composition particularly when it is irradiated with light emitted from an LED. On the other hand, although a rutile-type titanium oxide is somewhat inferior to an anatase-type titanium oxide in terms of whiteness, since it hardly shows any photoactivity, resin degradation (yellowing) caused by light that is attributed to the photoactivity of titanium oxide is notably inhibited and a rutile-type titanium oxide is also stable against heat. Therefore, when a rutile-type titanium oxide is used as a white pigment in an insulating layer of a printed circuit board equipped with an LED, a high reflectance can be maintained over a long time.

As such a rutile-type titanium oxide, a known one can be used. There are two kinds of methods of producing a rutile-type titanium oxide, sulfuric acid method and chlorine method. In the present invention, a rutile-type titanium oxide produced by either of these production methods can be suitably used. Here, the term "sulfuric acid method" refers to a production method in which ilmenite ore or titanium slug used as a raw material is dissolved in concentrated sulfuric acid to separate iron content as iron sulfate, the resulting solution is hydrolyzed to obtain hydroxide precipitates, and the thus obtained precipitates are then baked at a high temperature to recover rutile-type titanium oxide. Meanwhile, the term "chlorine method" refers to a production method in which synthetic or natural rutile used as a raw material is allowed to react with a chlorine gas and carbon at a high temperature of about 1,000° C. so as to synthesize titanium tetrachloride, which is then oxidized to recover rutile-type titanium oxide. A rutile-type titanium oxide produced by the chlorine method is preferably used in the present invention because it shows prominent effect of inhibiting degradation (yellowing) of a resin caused by heat in particular.

Examples of commercially available rutile-type titanium oxide that can be used include TIPAQUE R-820, TIPAQUE R-830, TIPAQUE R-930, TIPAQUE R-550, TIPAQUE R-630, TIPAQUE R-680, TIPAQUE R-670, TIPAQUE R-680, TIPAQUE R-670, TIPAQUE R-780, TIPAQUE R-850, TIPAQUE CR-50, TIPAQUE CR-57, TIPAQUE CR-Super 70, TIPAQUE CR-80, TIPAQUE CR-90, TIPAQUE CR-93, TIPAQUE CR-95, TIPAQUE CR-97, TIPAQUE CR-60, TIPAQUE CR-63, TIPAQUE CR-67, TIPAQUE CR-58, TIPAQUE CR-85 and TIPAQUE UT771 (all of which are manufactured by Ishihara Sangyo Kaisha, Ltd.); Ti-Pure R-100, Ti-Pure R-101, Ti-Pure R-102, Ti-Pure R-103, Ti-Pure R-104, Ti-Pure R-105, Ti-Pure R-108, Ti-Pure R-900, Ti-Pure R-902, Ti-Pure R-960, Ti-Pure R-706 and Ti-Pure R-931 (all of which are manufactured by Du Pont K.K.); and R-25, R-21, R-32, R-7E, R-5N, R-61N, R-62N, R-42, R-45M, R-44, R-49S, GTR-100, GTR-300, D-918, TCR-29, TCR-52 and FTR-700 (all of which are manufactured by Sakai Chemical Industry Co., Ltd.).

Thereamong, those which are produced by the chlorine method, such as TIPAQUE CR-50, TIPAQUE CR-57, TIPAQUE CR-80, TIPAQUE CR-90, TIPAQUE CR-93, TIPAQUE CR-95, TIPAQUE CR-97, TIPAQUE CR-60, TIPAQUE CR-63, TIPAQUE CR-67, TIPAQUE CR-58, TIPAQUE CR-85 and TIPAQUE UT771 (all of which are manufactured by Ishihara Sangyo Kaisha, Ltd.) and Ti-Pure R-100, Ti-Pure R-101, Ti-Pure R-102, Ti-Pure R-103, Ti-Pure R-104, Ti-Pure R-105, Ti-Pure R-108, Ti-Pure R-900, Ti-Pure R-902, Ti-Pure R-960, Ti-Pure R-706 and Ti-Pure R-931 (all of which are manufactured by Du Pont K.K.), can be more preferably used.

Further, as an anatase-type titanium oxide, a known one can be used. Examples of commercially available anatase-type titanium oxide that can be used include TITON A-110, TITON TCA-123E, TITON A-190, TITON A-197, TITON SA-1 and TITON SA-IL (all of which are manufactured by Sakai Chemical Industry Co., Ltd.); TA-100, TA-200, TA-300, TA-400, TA-500 and TP-2 (all of which are manufactured by Fuji Titanium Industry Co., Ltd.); TITANIX JA-1, TITANIX JA-3, TITANIX JA-4, TITANIX JA-5 and TITANIX JA-C(all of which are manufactured by TAYCA Corporation); KA-10, KA-15, KA-20 and KA-30 (all of which are manufactured by Titan Kogyo, Ltd.); and TIPAQUE A-100, TIPAQUE A-220 and TIPAQUE W-10 (all of which are manufactured by Ishihara Sangyo Kaisha, Ltd.).

The amount of the (A) white pigment to be incorporated is, in 100 parts by mass of the curable composition of the present invention, preferably 5 to 50 parts by mass, more preferably 10 to 30 parts by mass, particularly preferably 20 to 30 parts by mass. When the amount of the white pigment is 5 parts by mass or more, the composition has sufficient reflectance. Meanwhile, when the amount of the white pigment is 50 parts by mass or less, an excessive increase in the viscosity of the composition and deterioration in the printing properties can be inhibited.

[(B) (Meth)Acrylate Compound Having a Hydroxyl Group]

As the (B) (meth)acrylate compound having a hydroxyl group, a low-molecular-weight material such as a monomer or oligomer can be used. Specifically, a material having a molecular weight in the range of 100 to 1,000, preferably 110 to 700, can be used.

Specific examples of the (B) (meth)acrylate compound having a hydroxyl group include 2-hydroxy-3-acryloyloxypropyl (meth)acrylate, 2-hydroxy-3-phenoxyethyl (meth)acrylate, 1,4-cyclohexane dimethanol mono(meth)acrylate, 2-hydroxyethyl(meth)acrylate, 2-hydroxypropyl (meth)acrylate, 4-hydroxybutyl (meth)acrylate, pentaerythritol tri (meth)acrylate, dipentaerythritol monohydroxypenta(meth)acrylate and 2-hydroxypropyl (meth)acrylate. Examples of commercial products thereof include ARONIX M-5700 (manufactured by Toagosei Co., Ltd.; trade name); 4HBA, 2HEA and CHDMMA (all of which are manufactured by Nippon Kasei Chemical Co., Ltd.; trade names); BHEA, HPA, HEMA and HPMA (all of which are manufactured by Nippon Shokubai Co., Ltd.; trade names); and LIGHT ESTER HO, LIGHT ESTER HOP and LIGHT ESTER HOA (all of which are manufactured by Kyoeisha Chemical Co., Ltd.; trade names). As the (B) (meth)acrylate compound having a hydroxyl group, these compounds/products may be used individually or a plurality thereof may be used in combination.

Thereamong, particularly, 2-hydroxy-3-acryloyloxypropyl acrylate, 2-hydroxy-3-phenoxyethylacrylate, 2-hydroxyethylacrylate, 2-hydroxypropyl acrylate, 4-hydroxybutyl acrylate and 1,4-cyclohexane dimethanol monoacrylate can be preferably used. Further, a monofunctional (meth)acrylate compound can also be preferably used because of the easiness of adjusting its viscosity and the like.

The amount of the (B) (meth)acrylate compound having a hydroxyl group to be incorporated is, in 100 parts by mass of the curable composition of the present invention, preferably 5 to 50 parts by mass, more preferably 10 to 30 parts by mass. When the amount of the (meth)acrylate having a hydroxyl group is 5 parts by mass or more, good adhesiveness, which is a characteristic feature of the composition of the present invention, is attained. Meanwhile, when the amount of the (meth)acrylate having a hydroxyl group is 50 parts by mass or less, a reduction in the ink compatibility can be inhibited.

Because of such combination of the component (A), the component (B) and the below-described component (D), the curable composition of the present invention shows excellent dispersion even in a short dispersion time and has excellent adhesiveness to both a plastic substrate and a conductor circuit metal; therefore, it exhibits excellent substrate protection performance as, for example, a resist ink for a printed circuit board (such as an etching resist ink, a solder resist ink or a plating resist ink). In addition, the curable composition of the present invention also exhibits excellent properties as a cured coating film even with a small exposure does.

[(C) Photopolymerization Initiator]

The (C) photopolymerization initiator is not particularly restricted and, for example, a photo-radical polymerization initiator can be employed. As this photo-radical polymerization initiator, any compound can be used as long as it generates a radical when irradiated with light, laser, electron beam or the like and initiates a radical polymerization reaction.

Examples of the (C) photopolymerization initiator include benzoins and benzoin alkyl ethers, such as benzoin, benzoin methyl ether, benzoin ethyl ether and benzoin isopropyl ether; alkylphenone-based photopolymerization initiators such as 2-hydroxy-2-methyl-1-phenyl-propane-1-one; acetophenones such as acetophenone, 2,2-dimethoxy-2-phenylacetophenone, 2,2-diethoxy-2-phenylacetophenone and 1,1-dichloroacetophenone; aminoacetophenones such as 2-methyl-1-[4-(methylthio)phenyl]-2-morpholinopropane-1-one, 2-benzyl-2-dimethylamino-1-(4-morpholinophenyl)-butane-1-one and N,N-dimethylaminoacetophenone; anthraquinones such as 2-methylanthraquinone, 2-ethylanthraquinone, 2-t-butyl anthraquinone and 1-chloroanthraquinone; thioxanthones such as 2,4-dimethylthioxanthone, 2,4-diethylthioxanthone, 2-chlorothioxanthone and 2,4-diisopropylthioxanthone; ketals such as acetophenone dimethyl ketal and benzyl dimethyl ketal; 2,4,5-triaryl imidazole dimer; riboflavin tetrabutyrate; thiol compounds such as 2-mercaptobenzimidazole, 2-mercaptobenzoxazole and 2-mercaptobenzothiazole; organic halogen compounds such as 2,4,6-tris-s-triazine, 2,2,2-tribromoethanol and tribromomethylphenyl sulfone; benzophenones and xanthones, such as benzophenone and 4,4'-bis-diethylaminobenzophenone; acylphosphine oxide-based photopolymerization initiators such as 2,4,6-trimethylbenzoyldiphenylphosphine oxide and bis(2,4,6-trimethylbenzoyl)-phenylphosphine oxide; and titanocenes such as bis(cyclopentadienyl)-di-phenyl-titanium, bis(cyclopentadienyl)-di-chloro-titanium, bis(cyclopentadienyl)-bis(2,3,4,5,6-pentafluorophenyl)titanium and bis(cyclopentadienyl)-bis(2,6-difluoro-3-(pyrrole-1-yl)phenyl)titanium.

These known and commonly used photopolymerization initiators may be used individually, or two or more thereof may be used as a mixture. Further, a photoinitiator aid, for example, tertiary amines such as ethyl-N,N-dimethylaminobenzoate, isoamyl-N,N-dimethylaminobenzoate, pentyl-4-dimethylaminobenzoate, triethylamine or triethanolamine, can also be added.

Examples of commercially available photopolymerization initiator include IRGACURE 261, 184, 369, 651, 500, 819, 907, 784 and 2959, DAROCUR 1116, 1173, CGI1700, CGI1750, CGI1850 and CG-24-61, and LUCIRIN TPO and CGI-784 (all of which are manufactured by BASF Japan Ltd.; trade names); DAICAT II (manufactured by Daicel Corporation.; trade name); UVAC 1591 (manufactured by DAICEL-ALLNEX LTD.; trade name); RHODORSIL Photoinitiator 2074 (manufactured by Rhodia; trade name); EBECRYL P36 (manufactured by Solvay; trade name); and ESACURE KIP150, KIP65LT, KIP100F, KT37, KT55, KT046, KIP75/B and ONE (all of which are manufactured by Lamberti S.p.A; trade names).

The ratio of the (C) photopolymerization initiator to be incorporated is preferably in the range of 0.5 to 10 parts by mass with respect to 100 parts by mass of the curable composition of the present invention.

[(D) Wetting Dispersant]

As the (D) wetting dispersant, generally, a wetting dispersant having an effect of assisting dispersion of a pigment can be used. Examples of such wetting dispersant include compounds and polymeric compounds that contain a polar group (e.g., a carboxyl group, a hydroxyl group or an acid ester), such as acid-containing compounds (e.g., phosphates), acid group-containing copolymers, hydroxyl group-containing polycarboxylates, polysiloxanes, and salts formed by a long-chain polyaminoamide and an acid ester.

Further, among these wetting dispersants, those which have an acid value are preferred because of their superior effectiveness in dispersing an inorganic pigment such as titanium oxide.

Specific examples of a wetting dispersant having an acid value include ANTI-TERRA-U, ANTI-TERRA-U 100, ANTI-TERRA-204, ANTI-TERRA-205, DISPERBYK-101, DISPERBYK-102, DISPERBYK-106, DISPERBYK-110, DISPERBYK-111, DISPERBYK-130, DISPERBYK-140, DISPERBYK-142, DISPERBYK-145, DISPERBYK-170, DISPERBYK-171, DISPERBYK-174, DISPERBYK-180, DISPERBYK-2001, DISPERBYK-2025, DISPERBYK-2070, DISPERBYK-2096, BYK-P104, BYK-P1045, BYK-P105, BYK-9076 and BYK-220S (all of which are manufactured by BYK Chemie GMBH).

The acid values of these wetting dispersants having an acid value are preferably in the range of 10 to 300 mg KOH/g.

The amount of the above-described wetting dispersant to be incorporated is preferably 0.1 to 20 parts by mass, more preferably 1 to 10 parts by mass, with respect to 100 parts by mass of the white pigment.

(Bifunctional (Meth)acrylate Compound)

It is preferred that the curable composition for a printed circuit board according to the present invention further comprise a bifunctional (meth)acrylate compound (excluding those which have a hydroxyl group). By adding a bifunctional (meth)acrylate compound (excluding those which have a hydroxyl group), the compatibility of the components contained in the curable composition for a printed circuit board can be further improved.

Specific examples of the bifunctional (meth)acrylate compound (excluding those which have a hydroxyl group) include diol diacrylates such as 1,4-butanediol diacrylate, 1,6-hexanediol diacrylate, 1,9-nonanediol diacrylate and 1,10-decanediol diacrylate; glycol diacrylates such as ethylene glycol diacrylate, diethylene glycol diacrylate, triethylene glycol diacrylate, tetraethylene glycol diacrylate, polyethylene glycol diacrylate, dipropylene glycol diacrylate, tripropylene glycol diacrylate, polypropylene glycol diacrylate, neopentyl glycol diacrylate, diol diacrylates obtained by adding at least one of ethylene oxide and propylene oxide to neopentyl glycol, and caprolactone-modified hydroxypivalic acid neopentyl glycol diacrylate; and diacrylates having a cyclic structure such as bisphenol A EO-adduct diacrylate, bisphenol A PO-adduct diacrylate, tricyclodecane dimethanol diacrylate, hydrogenated dicyclopentadienyl diacrylate and cyclohexyl diacrylate.

Examples of commercially available bifunctional (meth) acrylate compound include LIGHT ACRYLATE 1,6HX-A, 1,9ND-A, 3EG-A and 4EG-A (manufactured by Kyoeisha Chemical Co., Ltd.; trade names); HDDA, 1,9-NDA, DPGDA and TPGDA (manufactured by DAICEL-ALLNEX LTD.; trade names); VISCOAT #195, #230, #230D, #260, #310HP, #335HP and #700HV (manufactured by Osaka Organic Chemical Industry Ltd.; trade names); and ARONIX M-208, M-211B, M-220, M-225, M-240 and M-270 ((manufactured by Toagosei Co., Ltd.; trade names).

Thereamong, from the standpoints of the viscosity and compatibility, diacrylates of diols containing an alkyl chain having 4 to 12 carbon atoms, particularly, 1,4-butanediol diacrylate, 1,6-hexanediol diacrylate, 1,9-nonanediol diacrylate and 1,10-decanediol diacrylate, are preferred.

The amount of such bifunctional acrylate compound to be incorporated is preferably 20 to 80 parts by mass, more preferably 40 to 70 parts by mass, in 100 parts by mass of the curable composition of the present invention. When the amount of the bifunctional (meth)acrylate is 20 parts by mass or more, the resulting ink has good compatibility. Meanwhile, when the amount is 80 parts by mass or less, the resulting ink has good adhesiveness.

The bifunctional (meth)acrylate compound has a viscosity of preferably 5 to 50 mPa·s, particularly preferably 5 to 30 mPa·s, at 25° C. In this viscosity range, the bifunctional (meth)acrylate compound shows good ease of handling as a diluent and the components can thus be homogeneously mixed. As a result, the entire surface of the resulting coating film can be expected to uniformly adhere to a substrate.

(Thermosetting Component)

A thermosetting component may be added to the curable composition of the present invention. By adding a thermosetting component, the adhesiveness and heat resistance are expected to be improved. Examples of a thermosetting component that can be used in the present invention include amino resins such as melamine resins, benzoguanamine resins, melamine derivatives and benzoguanamine derivatives; block isocyanate compounds; cyclocarbonate compounds; thermosetting components having a cyclic (thio)ether group(s); bismaleimides; and known thermosetting resins such as carbodiimide resins. Block isocyanate compounds are particularly preferred because of their excellent storage stability.

The above-described thermosetting component having a plurality of cyclic (thio)ether groups in the molecule is a compound which contains a plurality of one or two of 3-, 4- and 5-membered cyclic (thio)ether groups in the molecule. Examples thereof include compounds having a plurality of epoxy groups in the molecule, namely polyfunctional epoxy compounds; compounds having a plurality of oxetanyl groups in the molecule, namely polyfunctional oxetane compounds; and compounds having a plurality of thioether groups in the molecule, namely episulfide resins.

Examples of the above-described polyfunctional epoxy compounds include, but not limited to, epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Corporation, EPICLON 840, EPICLON 850, EPICLON 1050 and EPICLON 2055, which are manufactured by DIC Corporation, EPOTOHTO YD-011, YD-013, YD-127 and YD-128, which are manufactured by NIPPON STEEL & SUMIKIN CHEMICAL CO., LTD., D.E.R. 317, D.E.R. 331, D.E.R. 661 and D.E.R. 664, which are manufactured by The Dow Chemical Company, SUMI-EPDXY ESA-011, ESA-014, ELA-115 and ELA-128, which are manufactured by Sumitomo Chemical Co., Ltd., and A.E.R. 330, A.E.R. 331, A.E.R. 661 and A.E.R. 664, which are manufactured by Asahi kasei Corporation(all of the above are trade names); hydroquinone-type epoxy resin YDC-1312, bisphenol-type epoxy resin YSLV-80XY and thioether-type epoxy resin YSLV-120TE (all of which are manufactured by NIPPON STEEL & SUMIKIN CHEMICAL CO., LTD.); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by NIPPON STEEL & SUMIKIN CHEMICAL CO., LTD., D.E.R. 542 manufactured by The Dow Chemical Company, SUMI-EPDXY ESB-400 and ESB-700, which are manufactured by Sumitomo Chemical Co., Ltd., and A.E.R. 711 and A.E.R. 714, which are manufactured by Asahi kasei Corporation (all of the above are trade names); novolac-type epoxy resins such as jER152 and jER154, which are manufactured by Mitsubishi Chemical Corporation, D.E.N. 431 and D.E.N. 438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by NIPPON STEEL & SUMIKIN CHEMICAL CO., LTD., EPPN-201, EOCN-1025, EOCN-1020, EOCN-104S and RE-306, which are manufactured by Nippon Kayaku Co., Ltd., SUMI-EPDXY ESCN-195X and ESCN-220, which are manufactured by Sumitomo Chemical Co., Ltd., and A.E.R. ECN-235 and ECN-299, which are manufactured by Asahi kasei Corporation, (all of the above are trade names); biphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004, which are manufactured by NIPPON STEEL & SUMIKIN CHEMICAL CO., LTD. (all of the above are trade names); hydrogenated bisphenol A-type epoxy resins such as EPOTOHTO ST-2004, ST-2007 and ST-3000 (trade names), which are manufactured by NIPPON STEEL & SUMIKIN CHEMICAL CO., LTD.; glycidyl amine-type epoxy resins such as jER604 manufactured by Mitsubishi Chemical Corporation, EPOTOHTO YH-434 manufactured by NIPPON STEEL & SUMIKIN CHEMICAL CO., LTD., and SUMIEPDXY ELM-120 manufactured by Sumitomo Chemical Co., Ltd. (all of the above are trade names); hydantoin-type epoxy resins; alicyclic epoxy resins such as CELLOXIDE 2021 (trade name) manufactured by Daicel Corporation; trihydroxyphenyl methane-type epoxy resins such as YL-933 manufactured by Mitsubishi Chemical Corporation, and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by NIPPON STEEL & SUMIKIN CHEMICAL CO., LTD.; naphthalene group-containing epoxy resins such as ESN-190 and ESN-360, which are manufactured by NIPPON STEEL & SUMIKIN CHEMICAL CO., LTD., and HP-4032, EXA-4750 and EXA-4700, which are manufactured by DIC Corporation; epoxy resins having a dicyclopentadiene skeleton such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; epoxy-modified polybutadiene rubber derivatives (for example, PB-3600 manufactured by Daicel Corporation); and CTBN-modified epoxy resins (for example, YR-102 and YR-450 manufactured by NIPPON STEEL & SUMIKIN CHEMICAL CO., LTD.). These epoxy resins may be used individually, or two or more thereof may be used in combination. Thereamong, novolac-type epoxy resins, bixylenol-type epoxy resins, biphenol-type epoxy resins, biphenol novolac-type epoxy resins, naphthalene-type epoxy resins and mixtures thereof are particularly preferred.

Examples of the polyfunctional oxetane compounds include polyfunctional oxetanes such as bis[(3-methyl-3-oxcetanylmethoxy)methyl]ether, bis[(3-ethyl-3-oxcetanylmethoxy)methyl]ether, 1,4-bis[(3-methyl-3-oxcetanylmethoxy)methyl]benzene, 1,4-bis[(3-ethyl-3-oxcetanylmethoxy)methyl]benzene, (3-methyl-3-oxcetanyl) methyl acrylate, (3-ethyl-3-oxcetanyl)methyl acrylate, (3-methyl-3-oxcetanyl)methyl methacrylate, (3-ethyl-3-oxcetanyl)methyl methacrylate, and oligomers and copolymers thereof; and etherification products of an oxetane alcohol and a resin having a hydroxyl group such as a novolac resin, poly(p-hydroxystyrene), cardo-type bisphenol, calixarene, calix resorcin arene or a silsesquioxane. Other examples include copolymers of an unsaturated monomer having an oxetane ring and an alkyl (meth)acrylate.

Examples of the compounds having a plurality of cyclic thioether groups in the molecule include bisphenol A-type episulfide resin, YL7000 manufactured by Mitsubishi Chemical Corporation. Further, for example, an episulfide resin prepared by the same synthesis method. in which an oxygen atom of an epoxy group of a novolac-type epoxy resin is substituted with a sulfur atom, can also be used.

Examples of the amino resins such as melamine derivatives and benzoguanamine derivatives include methylol melamine compounds, methylol benzoguanamine compounds, methylol glycoluril compounds and methylol urea compounds. Further, alkoxymethylated melamine compounds, alkoxymethylated benzoguanamine compounds, alkoxymethylated glycoluril compounds and alkoxymethylated urea compounds can be obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and it may be, for example, a methoxymethyl group, an ethoxymethyl group, a propoxymethyl group or a butoxymethyl group. In particular, melamine derivatives whose formalin concentration is at a human- and environment-friendly level of 0.2% or less are preferred.

Examples of commercially available products of the above-described thermosetting components include CYMEL 300, 301, 303, 370, 325, 327, 701, 266, 267, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components may be used individually, or two or more thereof may be used in combination.

An isocyanate compound and a block isocyanate compound are compounds having a plurality of isocyanate groups or blocked isocyanate groups in one molecule. Examples of such a compound having a plurality of isocyanate groups or blocked isocyanate groups in one molecule include polyisocyanate compounds and block isocyanate compounds. Here, the term "blocked isocyanate group" refers to an isocyanate group that is protected and thus temporarily inactivated by a reaction with a blocking agent. When heated to a prescribed temperature, the blocking agent dissociates to yield an isocyanate group. It has been confirmed that, by adding the above-described polyisocyanate compound or blocked isocyanate compound, the curability of the curable composition and the toughness of the cured product thereof are improved.

As such polyisocyanate compound, for example, an aromatic polyisocyanate, an aliphatic polyisocyanate or an alicyclic polyisocyanate may be employed.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate as well as adducts, biurets and isocyanurates of the above-described isocyanate compounds.

As the blocked isocyanate compound, a product of an addition reaction between an isocyanate compound and an isocyanate blocking agent may be used. Examples of an isocyanate compound that can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as c-caprolactam, 6-valerolactam, y-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may also be a commercially available one and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumika Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Chemicals Inc.); and TPA-380E, 17B-60PX and E402-B80T (all of which are manufactured by Asahi Kasei Chemicals Corporation). It is noted here that SUMIDUR BL-3175 and BL-4265 are produced using methylethyl oxime as a blocking agent. The above-described compounds having a plurality of isocyanate groups or blocked isocyanate groups in one molecule may be used individually, or two or more thereof may be used in combination.

The amount of such thermosetting component to be incorporated is preferably 1 to 30 parts by mass in 100 parts by mass of the curable composition of the present invention. When the amount of the thermosetting component is 1 part by mass or more, a coating film having sufficient toughness and heat resistance can be obtained. Meanwhile, when the amount is 30 parts by mass or less, a reduction in the storage stability can be inhibited.

In the curable composition for a printed circuit board according to the present invention, in addition to the above-described components, as required, known and commonly used additives, for example, a surface tension-adjusting agent; a surfactant; a matting agent; a polyester-based resin for adjusting the film physical properties; a polyurethane-based resin; a vinyl-based resin; an acrylic resin; a rubber-based resin; a wax; a known and commonly used coloring agent such as phthalocyanine blue, phthalocyanine green, iodine green, disazo yellow, crystal violet, titanium oxide, carbon black or naphthalene black; at least one of silicone-based, fluorine-based or polymer-based antifoaming agents and leveling agents; and adhesiveness-imparting agent such as an imidazole-based, thiazole-based or triazole-based adhesiveness-imparting agent or a silane-coupling agent, can be incorporated.

Further, in the curable composition for a printed circuit board according to the present invention, in addition to the above-described components, a resin may also be incorporated in such an amount that does not adversely affect the properties of the curable composition. As the resin, any resin that is known and commonly used can be employed; however, a (meth)acrylate compound having a polyene skeleton is preferred. The above-described polyene skeleton is preferably formed by polymerization of, for example, either or both of polybutadiene and isoprene. It is particularly preferred that the polyene skeleton be constituted by repeating units represented by the Formula (I):

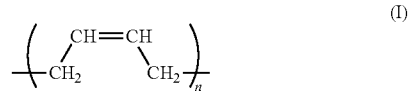

(wherein, n represents 10 to 300).

Because of the olefinic double bond of such repeating unit, the resulting curable resist composition for a printed circuit board is provided with flexibility as well as an increased conformability to a substrate, so that the curable resist composition shows good adhesiveness.

In the above-described polyene skeleton of the (meth)acrylate compound, the content of the repeating units represented by the Formula (I) is preferably not less than 50%, more preferably not less than 80%.

Further, the polyene skeleton of the (meth)acrylate compound may also contain a unit represented by the following Formula (II):

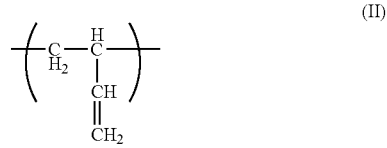

Specifically, for example, the following materials can be preferably used. That is, a liquid polybutadiene urethane (meth)acrylate obtained by urethane addition reaction of 2-hydroxyethyl (meth)acrylate with a hydroxyl group of a liquid polybutadiene via 2,4-tolylene diisocyanate; a liquid polybutadiene acrylate obtained by esterification reaction between a maleic anhydride-added maleated polybutadiene and 2-hydroxyacrylate; a liquid polybutadiene (meth)acrylate obtained by epoxy-esterification reaction between a carboxyl group of maleated polybutadiene and glycidyl (meth)acrylate; a liquid polybutadiene (meth)acrylate obtained by esterification reaction between an epoxidized polybutadiene, which is produced by allowing an epoxidizing agent to react with a liquid polybutadiene, and (meth)acrylic acid; a liquid polybutadiene (meth)acrylate obtained by dechlorination reaction of (meth)acrylic acid chloride with a hydroxyl group-containing liquid polybutadiene; and a liquid hydrogenated 1,2-polybutadiene (meth)acrylate obtained by modification of liquid hydrogenated 1,2-polybutadiene glycol, in which unsaturated double bond of a liquid polybutadiene having a hydroxyl group at both molecular terminals is hydrogenated, with urethane (meth)acrylate, can be preferably used.

Examples of commercial products thereof include NISSO PB TE-2000, NISSO PB TEA-1000, NISSO PB TE-3000 and NISSO PB TEAI-1000 (all of which are manufactured by Nippon Soda Co., Ltd.); CN301, CN303 and CN307 (all of which are manufactured by SARTOMER); BAC-15 (manufactured by Osaka Organic Chemical Industry Ltd.); BAC-45 (manufactured by Osaka Organic Chemical Industry Ltd.); and EY RESIN BR-45UAS (manufactured by Light Chemical Industries Co., Ltd.).

These (meth)acrylates having a polyene skeleton may be used individually or a plurality thereof may be used in combination.

Further, in the curable composition for a printed circuit board according to the present invention, a diluent may be incorporated for the purpose of adjusting the viscosity of the composition.

Examples of the diluent include dilution solvents, photoreactive diluents and heat-reactive diluents. Among these diluents, photoreactive diluents are preferred.

Examples of the photoreactive diluents include compounds having an unsaturated double bond, an oxetanyl group and/or an epoxy group, such as (meth)acrylates, vinyl ethers, ethylene derivatives, styrene, chloromethylstyrene, a-methylstyrene, maleic anhydride, dicyclopentadiene, N-vinylpyrrolidone, N-vinylformamide, xylylene dioxetane, oxetane alcohol, 3-ethyl-3-(phenoxymethyl)oxetane and resorcinol diglycidyl ether.

Thereamong, (meth)acrylates are preferred and monofunctional (meth)acrylates are more preferred. Examples of the monofunctional (meth)acrylates include (meth)acrylates such as methyl (meth)acrylate, ethyl (meth)acrylate, butyl (meth)acrylate, isobutyl (meth)acrylate, lauryl (meth)acrylate, stearyl (meth)acrylate, 2-hydroxyethyl (meth)acrylate, hydroxypropyl (meth)acrylate, hydroxybutyl (meth)acrylate and glycidyl methacrylate; and acryloyl morpholine.

The amount of such diluent to be incorporated is preferably 1 to 30 parts by mass in 100 parts by mass of the curable composition of the present invention.

Further, in the curable composition for a printed circuit board according to the present invention, a tri- or higher functional (meth)acrylate compound (excluding those which have a hydroxyl group) may be incorporated for the purpose of improving the tackiness of the composition after UV-curing.

Examples of the tri- or higher functional (meth)acrylate compound include polyfunctional acrylates represented by trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphoric acid triacrylate, propylene oxide-modified phosphoric acid triacrylate, epichlorohydrin-modified glycerol triacrylate, dipentaerythritol hexaacrylate, ditrimethylolpropane tetraacrylate and silsesquioxane modification products of these acrylates; methacrylate monomers corresponding to these acrylates; and c-caprolactone-modified trisacryloxyethyl isocyanurate. The amount of such tri- or higher functional (meth)acrylate compound to be incorporated is preferably 1 to 40 parts by mass in 100 parts by mass of the curable composition of the present invention.

The curable composition for a printed circuit board according to the present invention which comprises the above-described components can be applied to printing methods such as screen printing method, ink-jet method, dip coating method, flow coating method, roll coating method, bar coater method and curtain coating method. Particularly, in cases where the curable composition for a printed circuit board according to the present invention is applied to an ink-jet method, the viscosity thereof at 50° C. is preferably 5 to 50 mPa·s, more preferably 5 to 20 mPa·s. By this, the curable composition can be printed smoothly without applying unnecessary load to an ink-jet printer.

In the present invention, the viscosity is measured at normal temperature (25° C.) or 50° C. in accordance with JIS K2283. As long as the viscosity is 150 mPa·s or less at normal temperature or 5 to 50 mPa·s at 50° C., the curable composition can be printed by an ink-jet printing method.

Further, in cases where the curable composition for a printed circuit board according to the present invention which has the above-described constitution is applied as an ink for ink-jet method, the composition can be printed on a flexible wiring board by a roll-to-roll process. In this case, by installing the below-described light source for light irradiation in the downstream of an ink-jet printer, a pattern-cured coating film can be formed quickly.

The light irradiation can be performed with ultraviolet radiation or an active energy ray; however, it is preferably performed with ultraviolet radiation. As the light source for this light irradiation, for example, a low-pressure mercury lamp, a medium-pressure mercury lamp, a high-pressure mercury lamp, an ultrahigh-pressure mercury lamp, a xenon lamp or a metal halide lamp is appropriate. In addition, electron beams, α-ray, β-ray, γ-ray, X-ray, neutron beams and the like can also be used.

Further, after the light irradiation, as required, the curable composition is cured by heating. Here, the heating temperature is, for example, 80 to 200° C. By performing the heating in such temperature range, the curable composition can be sufficiently cured. The heating time is, for example, 10 to 100 minutes.

Moreover, the curable composition for a printed circuit board according to the present invention can form a pattern-cured coating film which exhibits excellent adhesion to a printed circuit board that comprises a plastic substrate containing polyimide or the like as a main component and a conductor circuit arranged thereon, as well as excellent properties in terms of solder heat resistance, chemical resistance, solvent resistance, pencil hardness, resistance to electroless gold plating, bending resistance and the like.

EXAMPLES

The present invention will now be described concretely by way of examples thereof; however, the present invention is not restricted to the following examples by any means. It is noted here that, unless otherwise specified, "part(s)" means "part(s) by mass" in the followings.

Examples 1 to 5, Comparative Examples 1 and 2

The components shown in Table 1 were blended at the respective ratios (unit: parts) shown in Table 1 and then premixed using a stirrer to prepare a white curable composition for a printed circuit board.

For the thus obtained white curable composition for a printed circuit board and a coating film thereof, the following properties were evaluated. The results are shown in Table 2 below.

1. Dispersibility

To a bead mill (DYNO Mill, manufactured by Shinmaru Enterprises Corporation), 5 kg of each of the photocurable compositions for a printed circuit board that were prepared in accordance with the respective formulations of Examples 1 to 5 and Comparative Examples 1 and 2 shown in Table 1 was loaded along with zirconia beads of 0.3 mm in diameter, and dispersion was carried out for 6 hours.

After 3 hours had passed from the start of the dispersion process, the resultant was sampled at hourly intervals until 6 hours from the start, and the maximum particle size was measured using a particle size distribution analyzer (MICROTRAC, manufactured by Nikkiso Co., Ltd.). Evaluation was made in accordance with the following criteria.

<Evaluation Criteria>
Maximum particle size=1 μm or larger: x
Maximum particle size=smaller than 1 μm: ○

2. Viscosity at 50° C.

For each of the curable compositions for a printed circuit board that were prepared in accordance with the respective formulations of Examples 1 to 5 and Comparative Examples 1 and 2 shown in Table 1, the viscosity at 50° C. and 100 rpm was measured using a cone plate-type viscometer (TVH-33H, manufactured by Toki Sangyo Co., Ltd.).

Evaluation Criteria
○: 20 mPa·s or less
Δ: higher than 20 mPa·s and 50 mPa·s or less 3. Filtration Efficiency Through a disc-type filter (ACRODISC, manufactured by Pall Corporation) of 1 μm in pore size and 37 mm in diameter, 5 kg of each of the curable compositions for a printed circuit board that were prepared in accordance with the respective formulations of Examples 1 to 5 and Comparative Examples 1 and 2 shown in Table 1 was filtered to evaluate the filtration efficiency.

Evaluation Criteria
○: The curable composition was filtered without causing clogging.
x: The curable composition caused clogging.

4. Y value

The curable compositions dispersed for 3 hours in the above 1. were each coated on a 13T substrate using a 30 μm applicator (manufactured by Erichsen GmbH & Co. KG) and then pre-cured using a high-pressure mercury lamp (HMW-713, manufactured by ORC Manufacturing Co., Ltd.) at 150 mJ/cm$^2$. Thereafter, in a 150° C. hot air circulation-type drying oven, the thus pre-cured composition was heat-cured for 60 minutes to obtain a cured coating film. The Y value of this cured coating film was measured using a spectrocolorimeter manufactured by Konica Minolta Co., Ltd., CM-2600d.
●: Y value=80% or higher
○: Y value=70% or higher
x: Y value=less than 70%

5. Adhesion with FR-4

The curable compositions dispersed for 3 hours in the above 1. were each coated on FR-4 using a 30 μm applicator (manufactured by Erichsen GmbH & Co. KG) and then cured using a high-pressure mercury lamp (HMW-713, manufactured by ORC Manufacturing Co., Ltd.) at 150 mJ/cm$^2$. Thereafter, in a 150° C. hot air circulation-type drying oven, the cured composition was heat-treated for 60 minutes. The thus obtained sample was subjected to a cross-cut tape peeling test (JIS K5600).
○: No detachment was observed.
x: Detachment was observed.
The test results are shown in Table 2.

6. Adhesion with Copper

The curable compositions dispersed for 3 hours in the above 1. were each coated on a copper foil (brand name is described below) using a 30 μm applicator (manufactured by Erichsen GmbH & Co. KG) and then cured using a high-pressure mercury lamp (HMW-713, manufactured by ORC Manufacturing Co., Ltd.) at 150 mJ/cm$^2$. Thereafter, in a 150° C. hot air circulation-type drying oven, the cured composition was heat-treated for 60 minutes. The thus obtained sample was subjected to a cross-cut tape peeling test.
○: No detachment was observed.
x: Detachment was observed.
The test results are shown in Table 2.

7. Pencil Hardness (Surface Hardness)

For the cured coating films obtained in the above 6., the pencil hardness of the surface was measured in accordance with JIS K5600-5-4.

8. Bending Resistance

A flexible copper-clad laminate constituted by a 25 μm-thick polyimide film and a comb-shaped copper wiring (wiring pattern) formed by 12 μm-thick copper foil was prepared (110 mm in length, 60 mm in width, copper wire width/space between copper wires=200 μm/200 μm). On this flexible copper-clad laminate substrate, the curable compositions dispersed for 3 hours in the above 1. were each coated to a film thickness of 15 μm by ink-jet printing using a piezo-type ink-jet printer. Here, immediately after the printing, the printed composition was pre-cured with UV using a high-pressure mercury lamp mounted on the ink jet head. Then, the resultant was heat-cured at 150° C. for 1 hour to obtain a test piece. Using an MIT (Massachusetts Institute of Technology) tester, the thus cured test piece was repeatedly bent under the below-described conditions with its protection film facing inside, and the number of cycles at which electrical conduction was no longer observed was determined. For each evaluation, three test pieces were tested and the average number of cycles at which electrical conduction was no longer observed was calculated. The test conditions and evaluation criteria were as follows.

MIT Resistance Test Conditions
Load: 500 gf
Angle: opposing angle of 135°
Rate: 175 times/minute
Tip: R0.38 mm cylinder Evaluation Criteria
○: 50 cycles or more
x: less than 50 cycles 9. Solvent Resistance The cured coating films obtained in the above 6. were immersed in acetone for 30 minutes and the condition of each coating film was visually observed and evaluated based on the following criteria.

Evaluation Criteria

◯: Absolutely no change was observed.

×: Swelling or detachment of the coating film was observed.

10. Chemical Resistance

The cured coating films obtained in the above 6. were immersed in 5 wt % aqueous sulfuric acid solution for 10 minutes and the condition of each coating film was visually observed and evaluated based on the following criteria.

Evaluation Criteria

◯: Absolutely no change was observed.

×: Swelling or detachment of the coating film was observed.

11. Solder Heat Resistance

In accordance with the method of JIS C-5012, the cured coating films obtained in the above 6. were immersed in a 260° C. solder bath for 10 seconds and then subjected to a peeling test with a cellophane adhesive tape. Thereafter, the condition of each coating film was visually observed and evaluated based on the following criteria.

Evaluation Criteria

◯: The coating film showed no change.

Δ: The coating film showed some changes.

×: The coating film was detached.

12. Resistance to Electroless Gold Plating

Using a commercially available electroless nickel plating bath and electroless gold plating bath, the cured coating films obtained in the above 6. were plated to a nickel thickness of 0.5 μm and a gold thickness of 0.03 μm. Then, the surface conditions of the resulting cured coating films were visually observed. The evaluation criteria were as follows.

Evaluation Criteria

◯: Absolutely no change was observed.

×: Prominent whitening or clouding was observed.

TABLE 1

|  | Example 1 | Example 2 | Example 3 | Example 4 | Example 5 | Comparative Example 1 | Comparative Example 2 |
|---|---|---|---|---|---|---|---|
| Bifunctional acrylate monomer*[1] | 20 | 20 | 20 | 20 |  | 20 | 20 |
| Hydroxyl group-containing acrylate monomer*[2] | 15 | 15 | 25 | 40 | 40 |  | 15 |
| Monofunctional acrylate monomer*[3] | 10 | 10 |  |  |  | 25 | 10 |
| Trifunctional methacrylate monomer*[4] | 30 | 30 | 30 | 30 | 30 | 30 | 30 |
| Initiator*[5] | 3 | 3 | 3 | 3 | 3 | 3 | 3 |
| Initiator*[6] | 4 | 4 | 4 | 4 | 4 | 4 | 4 |
| Thermosetting component*[7] | 10 | 10 | 10 | 10 | 10 | 10 | 10 |
| Wetting dispersant*[8] | 0.5 | 0.5 | 0.5 | 0.5 | 0.5 | 0.5 |  |
| Surface tension-adjusting agent*[9] | 0.05 | 0.05 | 0.05 | 0.05 | 0.05 | 0.05 | 0.05 |
| White pigment*[10] | 10 | 20 | 30 | 30 | 20 | 20 | 20 |
| Σ | 102.6 | 112.6 | 122.6 | 137.6 | 107.6 | 112.6 | 112.6 |
| White pigment content (%) | 9.8 | 17.8 | 24.5 | 21.8 | 18.6 | 17.8 | 17.9 |

*[1] 1,6-hexanediol diacrylate, manufactured by Daicel-Cytec Co., Ltd.
*[2] 4-hydroxybutyl acrylate, manufactured by Nippon Kasei Chemical Co., Ltd.
*[3] n-butyl acrylate, manufactured by Toagosei Co., Ltd.
*[4] trimethylolpropane triacrylate, manufactured by Toagosei Co., Ltd.
*[5] IRGACURE 907 (2-methyl-1-[4-(methylthio)phenyl]-2-morpholinopropane-1-one), manufactured by BASF Japan Ltd.
*[6] IRGACURE 819 (bis(2,4,6-trimethylbenzoyl)-phenylphosphine oxide), manufactured by BASF Japan Ltd.
*[7] BI7982, dimethylpyrazole-blocked trifunctional isocyanate, manufactured by Baxenden Chemicals Ltd.
*[8] DISPERBYK-111, acid group-containing copolymer, manufactured by BYK
*[9] BYK-307, dimethyl polysiloxane, manufactured by BYK
*[10] CR Super 70, rutile-type titanium oxide, manufactured by Ishihara Sangyo Kaisha, Ltd.

TABLE 2

|  | Example 1 | Example 2 | Example 3 | Example 4 | Example 5 | Comparative Example 1 | Comparative Example 2 |
|---|---|---|---|---|---|---|---|
| Maximum particle size (3-hour dispersion) | ◯ | ◯ | ◯ | ◯ | ◯ | X | X |
| Maximum particle size (4-hour dispersion) | ◯ | ◯ | ◯ | ◯ | ◯ | X | X |
| Maximum particle size (5-hour dispersion) | ◯ | ◯ | ◯ | ◯ | ◯ | ◯ | X |
| Maximum particle size (6-hour dispersion) | ◯ | ◯ | ◯ | ◯ | ◯ | ◯ | X |
| Viscosity | ◯ | ◯ | ◯ | ◯ | Δ | ◯ | ◯ |
| Filtration efficiency | ◯ | ◯ | ◯ | ◯ | ◯ | X | X |
| Y value | ◯ | ◯ | ⊚ | ⊚ | ◯ | ◯ | ◯ |
| Adhesion with FR-4 | ◯ | ◯ | ◯ | ◯ | ◯ | ◯ | ◯ |
| Adhesion with copper | ◯ | ◯ | ◯ | ◯ | ◯ | X | Δ |
| Pencil hardness | H | H | H | H | H | H | H |
| Bending resistance | ◯ | ◯ | ◯ | ◯ | ◯ | X | X |
| Solvent resistance | ◯ | ◯ | ◯ | ◯ | ◯ | X | Δ |
| Chemical resistance | ◯ | ◯ | ◯ | ◯ | ◯ | X | Δ |
| Solder Heat Resistance | ◯ | ◯ | ◯ | ◯ | ◯ | X | Δ |
| Resistance to Electroless Gold Plating | ◯ | ◯ | ◯ | ◯ | ◯ | X | Δ |

As shown in Table 2, the white curable compositions for a printed circuit board according to the present invention, which were obtained in Examples 1 to 5, showed good results for all of the dispersibility, filtration efficiency, Y value, adhesion with FR-4, adhesion with copper, pencil hardness, bending resistance, solvent resistance, chemical resistance, solder heat resistance and resistance to electroless gold plating.

On the other hand, it was confirmed that the compositions of Comparative Examples 1 and 2 which lacked either the component B or D of the present invention did not have satisfactory properties, showing poor dispersibility and filtration efficiency.

INDUSTRIAL APPLICABILITY

As described above, the white curable composition for a printed circuit board according to the present invention is capable of forming a fine pattern that is excellent in various properties required as a solder resist, such as solder heat resistance, chemical resistance, pencil hardness and resistance to electroless gold plating. Further, in order to make a composition sprayable by an ink-jet method, the composition is required to have a low viscosity. In general, low-viscosity photocurable compositions are considered to be poor in such properties as adhesiveness and heat resistance; however, the composition of the present invention can also be suitably used for forming a solder resist pattern on a printed circuit board by an ink-jet method even when the composition has a low viscosity. Therefore, the composition of the present invention can be applied to, for example, UV-molded materials, materials for optical fabrication and 3D ink-jet materials. Moreover, the curable composition for a printed circuit board according to the present invention can also be used as an ink for a resist other than a solder resist, such as an etching resist ink, a solder resist ink, a plating resist ink or a marking ink.

The invention claimed is:

1. A white curable composition for a printed circuit board, comprising:
    a white pigment;
    a (meth)acrylate compound having a hydroxyl group;
    a photopolymerization initiator;
    a wetting dispersant; and
    a thermosetting component which is one of an amino resin, a block isocyanate compound, a cyclocarbonate compound, a thermosetting resin having a cyclic (thio)ether group, a bismaleimide, and a carbodiimide resin.

2. The white curable composition for a printed circuit board according to claim 1, wherein the white pigment is titanium oxide.

3. The white curable composition for a printed circuit board according to claim 2, wherein the titanium oxide is a rutile-type titanium oxide.

4. A cured coating film, which is obtained by irradiating the white curable composition for a printed circuit board according to claim 3 with light.

5. A printed circuit board, comprising:
    a pattern-cured coating film obtained by printing the white curable composition for a printed circuit board according to claim 3 on a substrate and then irradiating the thus printed white curable composition with light.

6. The white curable composition for a printed circuit board according to claim 3, wherein the rutile-type titanium oxide is included in an amount of 9.8 to 24.5% of the white curable composition, and the thermosetting component is dimethylpyrazole-blocked trifunctional isocyanate.

7. The white curable composition for a printed circuit board according to claim 2, wherein the titanium oxide has a maximum particle size of 1 μm or smaller.

8. A cured coating film, which is obtained by irradiating the white curable composition for a printed circuit board according to claim 7 with light.

9. A printed circuit board, comprising:
    a pattern-cured coating film obtained by printing the white curable composition for a printed circuit board according to claim 7 on a substrate and then irradiating the thus printed white curable composition with light.

10. A cured coating film, which is obtained by irradiating the white curable composition for a printed circuit board according to claim 2 with light.

11. A printed circuit board, comprising:
    a pattern-cured coating film obtained by printing the white curable composition for a printed circuit board according to claim 2 on a substrate and then irradiating the thus printed white curable composition with light.

12. The white curable composition for a printed circuit board according to claim 1, wherein the wetting dispersant has an acid value.

13. The white curable composition for a printed circuit board according to claim 1, further comprising:
    a bifunctional (meth)acrylate compound.

14. The white curable composition for a printed circuit board according to claim 13, wherein the bifunctional (meth)acrylate compound has a viscosity of 5 to 50 mPa·s at 25° C.

15. The white curable composition for a printed circuit board according to claim 1, having a viscosity of 5 to 50 mPa·s at 50° C.

16. The white curable composition for a printed circuit board according to claim 1, having a Y value of 70 or greater at a film thickness of 30 μm.

17. A cured coating film, which is obtained by irradiating the white curable composition for a printed circuit board according to claim 1 with light.

18. A printed circuit board, comprising:
    a pattern-cured coating film obtained by printing the white curable composition for a printed circuit board according to claim 1 on a substrate and then irradiating the thus printed white curable composition with light.

19. A printed circuit board, comprising:
    a pattern-cured coating film obtained by printing the white curable composition for a printed circuit board according to claim 1 on a substrate by an ink-jet printing method and then irradiating the thus printed white curable composition with light.

20. The white curable composition for a printed circuit board according to claim 1, wherein the white pigment is included in an amount of 5 to 50 parts by mass in 100 parts by mass of the white curable composition.

* * * * *